(12) United States Patent
Lin et al.

(10) Patent No.: US 11,194,541 B2
(45) Date of Patent: *Dec. 7, 2021

(54) SYSTEMS AND METHODS OF DISTRIBUTING AUDIO TO ONE OR MORE PLAYBACK DEVICES

(71) Applicant: Sonos, Inc., Santa Barbara, CA (US)

(72) Inventors: Ted Lin, Ayer, MA (US); Romi Kadri, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 61 days.

This patent is subject to a terminal disclaimer.

(21) Appl. No.: 16/782,962

(22) Filed: Feb. 5, 2020

(65) Prior Publication Data

US 2020/0174743 A1   Jun. 4, 2020

Related U.S. Application Data

(63) Continuation of application No. 16/416,714, filed on May 20, 2019, now Pat. No. 10,592,200, which is a
(Continued)

(51) Int. Cl.
*G06F 3/16* (2006.01)
*H04R 3/04* (2006.01)
(Continued)

(52) U.S. Cl.
CPC .......... *G06F 3/165* (2013.01); *H03G 3/3005* (2013.01); *H04R 3/04* (2013.01); *H04R 3/12* (2013.01);
(Continued)

(58) Field of Classification Search
CPC .. G06F 3/165; H04R 3/04; H04R 3/12; H04R 27/00; H04R 2227/003; H04R 2227/005;
(Continued)

(56) References Cited

U.S. PATENT DOCUMENTS 4,296,278 A   10/1981   Cullison et al.
4,816,989 A   3/1989   Finn et al.
(Continued)

FOREIGN PATENT DOCUMENTS

EP   0251584 A2   1/1988
EP   0672985 A1   9/1995
(Continued)

OTHER PUBLICATIONS

Akyildiz et al., "Multimedia Group Synchronization Protocols for Integrated Services Networks," IEEE Journal on Selected Areas in Communications, 1996 pp. 162-173, vol. 14, No. 1.
(Continued)

*Primary Examiner* — Xu Mei
(74) *Attorney, Agent, or Firm* — Akerman LLP

(57) ABSTRACT

An example method includes receiving data indicating a configuration of one or more playback devices. The one or more playback devices may include one or more transducers. The method further includes, based on the received data, associating each of one or more audio streams respectively with at least one transducer of the one or more transducers. The method further includes generating the one or more audio streams and sending at least one of the generated one or more audio streams to each of the one or more playback devices. An example non-transitory computer readable medium and an example computing device related to the example method are also disclosed herein.

20 Claims, 6 Drawing Sheets

Related U.S. Application Data continuation of application No. 15/888,789, filed on Feb. 5, 2018, now Pat. No. 10,296,288, which is a continuation of application No. 15/009,319, filed on Jan. 28, 2016, now Pat. No. 9,886,234.

(51) Int. Cl.
| | | |
|---|---|---|
| H03G 3/30 | (2006.01) | |
| H04R 3/12 | (2006.01) | |
| H04R 27/00 | (2006.01) | |
| H03G 5/16 | (2006.01) | |
| H03G 7/00 | (2006.01) | |
| H03G 9/02 | (2006.01) | |

(52) U.S. Cl.
CPC ............ *H04R 27/00* (2013.01); *H03G 5/165* (2013.01); *H03G 7/002* (2013.01); *H03G 9/025* (2013.01); *H04R 2227/003* (2013.01); *H04R 2227/005* (2013.01)

(58) Field of Classification Search
CPC ...... H03G 5/165; H03G 9/025; H03G 3/3005; H03G 7/002
USPC .............................................. 700/94; 381/63
See application file for complete search history.

(56) References Cited

U.S. PATENT DOCUMENTS

| | | |
|---|---|---|
| 4,995,778 A | 2/1991 | Bruessel |
| 5,182,552 A | 1/1993 | Paynting |
| 5,218,710 A | 6/1993 | Yamaki et al. |
| 5,239,458 A | 8/1993 | Suzuki |
| 5,299,266 A | 3/1994 | Lumsden |
| 5,406,634 A | 4/1995 | Anderson et al. |
| 5,440,644 A | 8/1995 | Farinelli et al. |
| 5,467,342 A | 11/1995 | Logston et al. |
| 5,491,839 A | 2/1996 | Schotz |
| 5,553,222 A | 9/1996 | Milne et al. |
| 5,668,884 A | 9/1997 | Clair, Jr. et al. |
| 5,673,323 A | 9/1997 | Schotz et al. |
| 5,751,819 A | 5/1998 | Dorrough |
| 5,761,320 A | 6/1998 | Farinelli et al. |
| 5,808,662 A | 9/1998 | Kinney et al. |
| 5,815,689 A | 9/1998 | Shaw et al. |
| 5,867,691 A | 2/1999 | Shiraishi |
| 5,875,354 A | 2/1999 | Charlton et al. |
| 5,887,143 A | 3/1999 | Saito et al. |
| 5,910,991 A | 6/1999 | Farrar |
| 5,923,902 A | 7/1999 | Inagaki |
| 5,946,343 A | 8/1999 | Schotz et al. |
| 5,956,088 A | 9/1999 | Shen et al. |
| 6,009,457 A | 12/1999 | Moller |
| 6,026,150 A | 2/2000 | Frank et al. |
| 6,031,818 A | 2/2000 | Lo et al. |
| 6,032,202 A | 2/2000 | Lea et al. |
| 6,108,686 A | 8/2000 | Williams, Jr. |
| 6,128,318 A | 10/2000 | Sato |
| 6,157,957 A | 12/2000 | Berthaud |
| 6,175,872 B1 | 1/2001 | Neumann et al. |
| 6,185,737 B1 | 2/2001 | Northcutt et al. |
| 6,195,436 B1 | 2/2001 | Scibora et al. |
| 6,199,169 B1 | 3/2001 | Voth |
| 6,255,961 B1 | 7/2001 | Van Ryzin et al. |
| 6,256,554 B1 | 7/2001 | Dilorenzo |
| 6,308,207 B1 | 10/2001 | Tseng et al. |
| 6,324,586 B1 | 11/2001 | Johnson |
| 6,332,147 B1 | 12/2001 | Moran et al. |
| 6,349,339 B1 | 2/2002 | Williams |
| 6,351,821 B1 | 2/2002 | Voth |
| 6,404,811 B1 | 6/2002 | Cvetko et al. |
| 6,430,353 B1 | 8/2002 | Honda et al. |
| 6,469,633 B1 | 10/2002 | Wachter et al. |
| 6,487,296 B1 | 11/2002 | Allen et al. |
| 6,522,886 B1 | 2/2003 | Youngs et al. |
| 6,526,325 B1 | 2/2003 | Sussman et al. |
| 6,587,127 B1 | 7/2003 | Leeke et al. |
| 6,598,172 B1 | 7/2003 | Vandeusen et al. |
| 6,611,537 B1 | 8/2003 | Edens et al. |
| 6,611,678 B1 | 8/2003 | Zweig et al. |
| 6,631,410 B1 | 10/2003 | Kowalski et al. |
| 6,674,803 B1 | 1/2004 | Kesselring |
| 6,704,421 B1 | 3/2004 | Kitamura |
| 6,757,517 B2 | 6/2004 | Chang et al. |
| 6,778,869 B2 | 8/2004 | Champion |
| 6,826,283 B1 | 11/2004 | Wheeler et al. |
| 6,836,788 B2 | 12/2004 | Kim et al. |
| 6,898,642 B2 | 5/2005 | Chafle et al. |
| 6,912,610 B2 | 6/2005 | Spencer |
| 6,920,373 B2 | 7/2005 | Xi et al. |
| 6,934,766 B1 | 8/2005 | Russell |
| 6,985,694 B1 | 1/2006 | De Bonet et al. |
| 7,007,106 B1 | 2/2006 | Flood et al. |
| 7,020,791 B1 | 3/2006 | Aweya et al. |
| 7,043,651 B2 | 5/2006 | Aweya et al. |
| 7,047,308 B2 | 5/2006 | Deshpande |
| 7,072,477 B1 | 7/2006 | Kincaid |
| 7,113,999 B2 | 9/2006 | Pestoni et al. |
| 7,115,017 B1 | 10/2006 | Laursen et al. |
| 7,130,608 B2 | 10/2006 | Hollstrom et al. |
| 7,130,616 B2 | 10/2006 | Janik |
| 7,143,141 B1 | 11/2006 | Morgan et al. |
| 7,143,939 B2 | 12/2006 | Henzerling |
| 7,162,315 B2 | 1/2007 | Gilbert |
| 7,185,090 B2 | 2/2007 | Kowalski et al. |
| 7,187,947 B1 | 3/2007 | White et al. |
| 7,206,367 B1 | 4/2007 | Moore et al. |
| 7,209,795 B2 | 4/2007 | Sullivan et al. |
| 7,218,708 B2 | 5/2007 | Berezowski et al. |
| 7,236,739 B2 | 6/2007 | Chang et al. |
| 7,236,773 B2 | 6/2007 | Thomas |
| 7,293,060 B2 | 11/2007 | Komsi |
| 7,295,548 B2 | 11/2007 | Blank et al. |
| 7,312,785 B2 | 12/2007 | Tsu et al. |
| 7,324,857 B2 | 1/2008 | Goddard |
| 7,333,519 B2 | 2/2008 | Sullivan et al. |
| 7,372,846 B2 | 5/2008 | Zwack |
| 7,391,791 B2 | 6/2008 | Balassanian et al. |
| 7,392,102 B2 | 6/2008 | Sullivan et al. |
| 7,483,538 B2 | 1/2009 | McCarty et al. |
| 7,483,958 B1 | 1/2009 | Elabbady et al. |
| 7,490,044 B2 | 2/2009 | Kulkarni |
| 7,496,623 B2 | 2/2009 | Szeto et al. |
| 7,496,633 B2 | 2/2009 | Szeto et al. |
| 7,519,188 B2 | 4/2009 | Berardi et al. |
| 7,571,014 B1 | 8/2009 | Lambourne et al. |
| 7,574,274 B2 | 8/2009 | Holmes |
| 7,599,685 B2 | 10/2009 | Goldberg et al. |
| 7,630,500 B1 | 12/2009 | Beckman et al. |
| 7,630,501 B2 | 12/2009 | Blank et al. |
| 7,643,894 B2 | 1/2010 | Braithwaite et al. |
| 7,657,224 B2 | 2/2010 | Goldberg et al. |
| 7,657,644 B1 | 2/2010 | Zheng |
| 7,657,910 B1 | 2/2010 | McAulay et al. |
| 7,668,990 B2 | 2/2010 | Krzyzanowski et al. |
| 7,669,219 B2 | 2/2010 | Scott, III et al. |
| 7,675,943 B2 | 3/2010 | Mosig et al. |
| 7,676,142 B1 | 3/2010 | Hung |
| 7,702,279 B2 | 4/2010 | Ko et al. |
| 7,720,096 B2 | 5/2010 | Klemets |
| 7,725,533 B2 | 5/2010 | Szeto et al. |
| 7,725,551 B2 | 5/2010 | Szeto et al. |
| 7,742,740 B2 | 6/2010 | Goldberg et al. |
| 7,835,689 B2 | 11/2010 | Goldberg et al. |
| 7,853,341 B2 | 12/2010 | McCarty et al. |
| 7,865,137 B2 | 1/2011 | Goldberg et al. |
| 7,885,622 B2 | 2/2011 | Krampf et al. |
| 7,916,877 B2 | 3/2011 | Goldberg et al. |
| 7,917,082 B2 | 3/2011 | Goldberg et al. |
| 7,934,239 B1 | 4/2011 | Dagman |
| 7,987,294 B2 | 7/2011 | Bryce et al. |
| 8,014,423 B2 | 9/2011 | Thaler et al. |
| 8,023,663 B2 | 9/2011 | Goldberg |

(56) References Cited

U.S. PATENT DOCUMENTS

| | | |
|---|---|---|
| 8,028,038 B2 | 9/2011 | Weel |
| 8,028,323 B2 | 9/2011 | Weel |
| 8,045,952 B2 | 10/2011 | Qureshey et al. |
| 8,050,652 B2 | 11/2011 | Qureshey et al. |
| 8,063,698 B2 | 11/2011 | Howard |
| 8,074,253 B1 | 12/2011 | Nathan |
| 8,086,752 B2 | 12/2011 | Millington et al. |
| 8,103,009 B2 | 1/2012 | McCarty et al. |
| 8,112,032 B2 | 2/2012 | Ko et al. |
| 8,131,390 B2 | 3/2012 | Braithwaite et al. |
| 8,139,774 B2 | 3/2012 | Berardi et al. |
| 8,160,281 B2 | 4/2012 | Kim et al. |
| 8,169,938 B2 | 5/2012 | Duchscher et al. |
| 8,175,292 B2 | 5/2012 | Aylward et al. |
| 8,214,873 B2 | 7/2012 | Weel |
| 8,229,125 B2 | 7/2012 | Short |
| 8,230,099 B2 | 7/2012 | Weel |
| 8,233,632 B1 | 7/2012 | MacDonald et al. |
| 8,234,395 B2 | 7/2012 | Millington |
| 8,238,578 B2 | 8/2012 | Aylward |
| 8,243,961 B1 | 8/2012 | Morrill |
| 8,265,310 B2 | 9/2012 | Berardi et al. |
| 8,290,185 B2 | 10/2012 | Kim |
| 8,290,603 B1 | 10/2012 | Lambourne |
| 8,306,235 B2 | 11/2012 | Mahowald |
| 8,315,555 B2 | 11/2012 | Ko et al. |
| 8,325,935 B2 | 12/2012 | Rutschman |
| 8,331,585 B2 | 12/2012 | Hagen et al. |
| 8,370,678 B2 | 2/2013 | Millington et al. |
| 8,391,501 B2 | 3/2013 | Khawand et al. |
| 8,423,659 B2 | 4/2013 | Millington |
| 8,452,020 B2 | 5/2013 | Gregg et al. |
| 8,483,853 B1 | 7/2013 | Lambourne |
| 8,521,316 B2 | 8/2013 | Louboutin |
| 8,577,045 B2 | 11/2013 | Gibbs |
| 8,588,949 B2 | 11/2013 | Lambourne et al. |
| 8,600,075 B2 | 12/2013 | Lim |
| 8,620,006 B2 | 12/2013 | Berardi et al. |
| 8,775,546 B2 | 7/2014 | Millington |
| 8,855,319 B2 | 10/2014 | Liu et al. |
| 8,879,761 B2 | 11/2014 | Johnson et al. |
| 8,914,559 B2 | 12/2014 | Kalayjian et al. |
| 8,934,647 B2 | 1/2015 | Joyce et al. |
| 8,934,655 B2 | 1/2015 | Breen et al. |
| 8,942,252 B2 | 1/2015 | Balassanian et al. |
| 8,965,546 B2 | 2/2015 | Visser et al. |
| 8,977,974 B2 | 3/2015 | Kraut |
| 8,984,442 B2 | 3/2015 | Pirnack et al. |
| 9,020,153 B2 | 4/2015 | Britt, Jr. |
| 9,367,283 B2 | 6/2016 | Kuper |
| 9,679,054 B2 | 6/2017 | Lin et al. |
| 9,886,234 B2 * | 2/2018 | Lin .................. H04R 3/04 |
| 10,296,288 B2 * | 5/2019 | Lin .................. H04R 3/04 |
| 10,469,897 B2 | 11/2019 | Reimann et al. |
| 10,592,200 B2 * | 3/2020 | Lin .................. H04R 27/00 |
| 2001/0009604 A1 | 7/2001 | Ando et al. |
| 2001/0022823 A1 | 9/2001 | Renaud |
| 2001/0032188 A1 | 10/2001 | Miyabe et al. |
| 2001/0042107 A1 | 11/2001 | Palm |
| 2002/0002039 A1 | 1/2002 | Qureshey et al. |
| 2002/0002562 A1 | 1/2002 | Moran et al. |
| 2002/0003548 A1 | 1/2002 | Krusche et al. |
| 2002/0022453 A1 | 2/2002 | Balog et al. |
| 2002/0026442 A1 | 2/2002 | Lipscomb et al. |
| 2002/0034374 A1 | 3/2002 | Barton |
| 2002/0042844 A1 | 4/2002 | Chiazzese |
| 2002/0049843 A1 | 4/2002 | Barone et al. |
| 2002/0065926 A1 | 5/2002 | Hackney et al. |
| 2002/0072816 A1 | 6/2002 | Shdema, III et al. |
| 2002/0073228 A1 | 6/2002 | Cognet et al. |
| 2002/0090914 A1 | 7/2002 | Kang et al. |
| 2002/0093478 A1 | 7/2002 | Yeh |
| 2002/0109710 A1 | 8/2002 | Holtz et al. |
| 2002/0112244 A1 | 8/2002 | Liou et al. |
| 2002/0124097 A1 | 9/2002 | Isely et al. |
| 2002/0129156 A1 | 9/2002 | Yoshikawa |
| 2002/0143998 A1 | 10/2002 | Rajagopal et al. |
| 2002/0163361 A1 | 11/2002 | Parkin |
| 2002/0165921 A1 | 11/2002 | Sapieyevski |
| 2002/0188762 A1 | 12/2002 | Tomassetti et al. |
| 2003/0002609 A1 | 1/2003 | Faller et al. |
| 2003/0020763 A1 | 1/2003 | Mayer et al. |
| 2003/0023741 A1 | 1/2003 | Tomassetti et al. |
| 2003/0035444 A1 | 2/2003 | Zwack |
| 2003/0041173 A1 | 2/2003 | Hoyle |
| 2003/0041174 A1 | 2/2003 | Wen et al. |
| 2003/0043924 A1 | 3/2003 | Haddad et al. |
| 2003/0066094 A1 | 4/2003 | Van Der Schaar et al. |
| 2003/0099212 A1 | 5/2003 | Anjum et al. |
| 2003/0099221 A1 | 5/2003 | Rhee |
| 2003/0126211 A1 | 7/2003 | Anttila et al. |
| 2003/0157951 A1 | 8/2003 | Hasty |
| 2003/0195964 A1 | 10/2003 | Mane |
| 2003/0198257 A1 | 10/2003 | Sullivan et al. |
| 2003/0210796 A1 | 11/2003 | McCarty et al. |
| 2003/0231871 A1 | 12/2003 | Ushimaru |
| 2003/0235304 A1 | 12/2003 | Evans et al. |
| 2004/0001484 A1 | 1/2004 | Ozguner |
| 2004/0001591 A1 | 1/2004 | Mani et al. |
| 2004/0008852 A1 | 1/2004 | Also et al. |
| 2004/0010727 A1 | 1/2004 | Fujinami |
| 2004/0015252 A1 | 1/2004 | Aiso et al. |
| 2004/0024478 A1 | 2/2004 | Hans et al. |
| 2004/0024925 A1 | 2/2004 | Cypher et al. |
| 2004/0027166 A1 | 2/2004 | Mangum et al. |
| 2004/0032348 A1 | 2/2004 | Lai et al. |
| 2004/0066736 A1 | 4/2004 | Kroeger |
| 2004/0075767 A1 | 4/2004 | Neuman et al. |
| 2004/0131192 A1 | 7/2004 | Metcalf |
| 2004/0170383 A1 | 9/2004 | Mazur |
| 2004/0203378 A1 | 10/2004 | Powers |
| 2004/0237750 A1 | 12/2004 | Smith et al. |
| 2004/0249965 A1 | 12/2004 | Huggins et al. |
| 2004/0249982 A1 | 12/2004 | Arnold et al. |
| 2004/0252400 A1 | 12/2004 | Blank et al. |
| 2005/0010691 A1 | 1/2005 | Oyadomari et al. |
| 2005/0013394 A1 | 1/2005 | Rausch et al. |
| 2005/0021590 A1 | 1/2005 | Debique et al. |
| 2005/0047605 A1 | 3/2005 | Lee et al. |
| 2005/0058149 A1 | 3/2005 | Howe |
| 2005/0081213 A1 | 4/2005 | Suzuoki et al. |
| 2005/0114538 A1 | 5/2005 | Rose |
| 2005/0125357 A1 | 6/2005 | Saadat et al. |
| 2005/0157885 A1 | 7/2005 | Olney et al. |
| 2005/0177643 A1 | 8/2005 | Xu |
| 2005/0181348 A1 | 8/2005 | Carey et al. |
| 2005/0195205 A1 | 9/2005 | Abrams, Jr. |
| 2005/0201254 A1 | 9/2005 | Looney et al. |
| 2005/0281255 A1 | 12/2005 | Davies et al. |
| 2005/0283820 A1 | 12/2005 | Richards et al. |
| 2005/0288805 A1 | 12/2005 | Moore et al. |
| 2005/0289224 A1 | 12/2005 | Deslippe et al. |
| 2006/0095516 A1 | 5/2006 | Wijeratne |
| 2006/0119497 A1 | 6/2006 | Miller et al. |
| 2006/0143236 A1 | 6/2006 | Wu |
| 2007/0038999 A1 | 2/2007 | Millington |
| 2007/0048713 A1 | 3/2007 | Plastina et al. |
| 2007/0054680 A1 | 3/2007 | Mo et al. |
| 2007/0136778 A1 | 6/2007 | Birger et al. |
| 2007/0142022 A1 | 6/2007 | Madonna et al. |
| 2007/0142944 A1 | 6/2007 | Goldberg et al. |
| 2007/0143493 A1 | 6/2007 | Mullig et al. |
| 2007/0169115 A1 | 7/2007 | Ko et al. |
| 2007/0180137 A1 | 8/2007 | Rajapakse |
| 2007/0224937 A1 | 9/2007 | Jung et al. |
| 2007/0226530 A1 | 9/2007 | Celinski et al. |
| 2007/0271388 A1 | 11/2007 | Bowra et al. |
| 2007/0299778 A1 | 12/2007 | Haveson et al. |
| 2008/0002839 A1 | 1/2008 | Eng |
| 2008/0022320 A1 | 1/2008 | Ver Steeg |
| 2008/0052371 A1 | 2/2008 | Partovi et al. |
| 2008/0059510 A1 | 3/2008 | Cardamore et al. |
| 2008/0089268 A1 | 4/2008 | Kinder et al. |
| 2008/0091771 A1 | 4/2008 | Allen et al. |

(56) References Cited

U.S. PATENT DOCUMENTS

| | | |
|---|---|---|
| 2008/0098027 A1 | 4/2008 | Aarts |
| 2008/0120429 A1 | 5/2008 | Millington et al. |
| 2008/0144861 A1 | 6/2008 | Melanson et al. |
| 2008/0175411 A1 | 7/2008 | Greve |
| 2009/0024662 A1 | 1/2009 | Park et al. |
| 2009/0031336 A1 | 1/2009 | Chavez et al. |
| 2009/0047993 A1 | 2/2009 | Vasa |
| 2009/0157905 A1 | 6/2009 | Davis |
| 2009/0222115 A1 | 9/2009 | Malcolm et al. |
| 2009/0228919 A1 | 9/2009 | Zott et al. |
| 2009/0298420 A1 | 12/2009 | Haartsen et al. |
| 2010/0049835 A1 | 2/2010 | Ko et al. |
| 2010/0076577 A1 | 3/2010 | Lee et al. |
| 2010/0142735 A1 | 6/2010 | Yoon et al. |
| 2010/0228740 A1 | 9/2010 | Cannistraro et al. |
| 2010/0316237 A1 | 12/2010 | Elberbaum |
| 2010/0318917 A1 | 12/2010 | Holladay et al. |
| 2011/0040395 A1 | 2/2011 | Kraemer et al. |
| 2011/0066943 A1 | 3/2011 | Brillon et al. |
| 2011/0170710 A1 | 7/2011 | Son |
| 2012/0029671 A1 | 2/2012 | Millington et al. |
| 2012/0030366 A1 | 2/2012 | Collart et al. |
| 2012/0051558 A1 | 3/2012 | Kim et al. |
| 2012/0058727 A1 | 3/2012 | Cook et al. |
| 2012/0060046 A1 | 3/2012 | Millington |
| 2012/0070004 A1 | 3/2012 | Labosco et al. |
| 2012/0087503 A1 | 4/2012 | Watson et al. |
| 2012/0117586 A1 | 5/2012 | McCoy et al. |
| 2012/0127831 A1 | 5/2012 | Gicklhorn et al. |
| 2012/0129446 A1 | 5/2012 | Ko et al. |
| 2012/0206623 A1 | 8/2012 | Nakama |
| 2012/0233639 A1 | 9/2012 | Zott et al. |
| 2012/0263325 A1 | 10/2012 | Freeman et al. |
| 2013/0010970 A1 | 1/2013 | Hegarty et al. |
| 2013/0028443 A1 | 1/2013 | Pance et al. |
| 2013/0080599 A1 | 3/2013 | Ko et al. |
| 2013/0191454 A1 | 7/2013 | Oliver et al. |
| 2013/0259254 A1 | 10/2013 | Xiang et al. |
| 2013/0279888 A1 | 10/2013 | Zeng et al. |
| 2014/0016784 A1 | 1/2014 | Sen et al. |
| 2014/0016786 A1 | 1/2014 | Sen |
| 2014/0016802 A1 | 1/2014 | Sen |
| 2014/0023196 A1 | 1/2014 | Xiang et al. |
| 2014/0112481 A1 | 4/2014 | Li et al. |
| 2014/0184734 A1 | 7/2014 | Nakagawa |
| 2014/0219456 A1 | 8/2014 | Morrell et al. |
| 2014/0226823 A1 | 8/2014 | Sen et al. |
| 2014/0237361 A1 | 8/2014 | Martin et al. |
| 2014/0294200 A1 | 10/2014 | Baumgarte et al. |
| 2014/0310779 A1 | 10/2014 | Lof et al. |
| 2014/0323036 A1 | 10/2014 | Daley et al. |
| 2014/0330951 A1 | 11/2014 | Sukoff et al. |
| 2014/0337959 A1 | 11/2014 | Garmark et al. |
| 2014/0355768 A1 | 12/2014 | Sen et al. |
| 2014/0355794 A1 | 12/2014 | Morrell et al. |
| 2015/0063610 A1 | 3/2015 | Mossner |
| 2015/0067054 A1 | 3/2015 | Yoo et al. |
| 2015/0146886 A1 | 5/2015 | Baumgarte |
| 2015/0170657 A1 | 6/2015 | Thompson et al. |
| 2015/0201274 A1 | 7/2015 | Ellner et al. |
| 2015/0281866 A1 | 10/2015 | Williams et al. |
| 2015/0288824 A1 | 10/2015 | Quiers |
| 2016/0066116 A1 | 3/2016 | Grant et al. |
| 2016/0080881 A1 | 3/2016 | Dublin et al. |
| 2016/0286330 A1 | 9/2016 | Kofman et al. |
| 2016/0295283 A1 | 10/2016 | Avanzi et al. |
| 2016/0350067 A1 | 12/2016 | Sundaresan et al. |
| 2018/0027033 A1 | 1/2018 | Kamstrup |
| 2018/0027368 A1 | 1/2018 | Girardier et al. |

FOREIGN PATENT DOCUMENTS

| | | |
|---|---|---|
| EP | 1111527 A2 | 6/2001 |
| EP | 1133896 B1 | 8/2002 |
| EP | 1389853 A1 | 2/2004 |
| EP | 1825713 B1 | 10/2012 |
| EP | 2860992 A1 | 4/2015 |
| KR | 1020070040592 | 4/2007 |
| KR | 20100071724 | 6/2010 |
| KR | 20100134164 | 12/2010 |
| KR | 20110064635 | 6/2011 |
| WO | 199525313 | 9/1995 |
| WO | 199961985 | 12/1999 |
| WO | 200153994 | 7/2001 |
| WO | 2003093950 A2 | 11/2003 |
| WO | 2005013047 A2 | 2/2005 |
| WO | 2012106269 | 8/2012 |
| WO | 2015024881 A1 | 2/2015 |

OTHER PUBLICATIONS

AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Benslimane Abderrahim, "A Multimedia Synchronization Protocol for Multicast Groups," Proceedings of the 26th Euromicro Conference, 2000, pp. 456-463, vol. 1.
Biersack et al., "Intra- and Inter-Stream Synchronization for Stored Multimedia Streams," IEEE International Conference on Multimedia Computing and Systems, 1996, pp. 372-381.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Bretl W.E., et al., MPEG2 Tutorial [online], 2000 [retrieved on Jan. 13, 2009] Retrieved from the Internet:(http://www.bretl.com/mpeghtml/MPEGindex.htm), pp. 1-23.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Final Office Action dated May 22, 2017, issued in connection with U.S. Appl. No. 15/009,319, filed Jan. 28, 2016, 24 pages.
Huang C.M., et al., "A Synchronization Infrastructure for Multicast Multimedia at the Presentation Layer," IEEE Transactions on Consumer Electronics, 1997, pp. 370-380, vol. 43, No. 3.
International Searching Authority, International Search Report and Written Opinion dated May 29, 2015, issued in connection with International Application No. PCT/US2015/018850, filed on Mar. 5, 2015, 13 pages.
Ishibashi et al., "A Group Synchronization Mechanism for Live Media in Multicast Communications," IEEE Global Telecommunications Conference, 1997, pp. 746-752, vol. 2.
Ishibashi et al., "A Group Synchronization Mechanism for Stored Media in Multicast Communications," IEEE Information Revolution and Communications, 1997, pp. 692-700, vol. 2.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Mills, David L., "Network Time Protocol (Version 3) Specification, Implementation and Analysis," Network Working Group, Mar. 1992, 7 pages.
Mills, David L., "Precision Synchronization of Computer Network Clocks," ACM SIGCOMM Computer Communication Review, 1994, pp. 28-43, vol. 24, No. 2.
Motorola, "Simplefi, Wireless Digital Audio Receiver, Installation and User Guide," Dec. 31, 2001, 111 pages.
Nilsson, M., "ID3 Tag Version 2," Mar. 26, 1998, 28 pages.
Non-Final Office Action dated Sep. 10, 2015, issued in connection with U.S. Appl. No. 14/197,403, filed Mar. 5, 2014, 16 pages.

(56) References Cited

OTHER PUBLICATIONS

Non-Final Office Action dated Dec. 14, 2016, issued in connection with U.S. Appl. No. 15/009,319, filed Jan. 28, 2016, 21 pages.
Non-Final Office Action dated Jul. 18, 2019, issued in connection with U.S. Appl. No. 16/416,714, filed May 20, 2019, 10 pages.
Non-Final Office Action dated Oct. 19, 2015, issued in connection with U.S. Appl. No. 14/337,770, filed Jul. 22, 2014, 11 pages.
Non-Final Office Action dated Oct. 2, 2018, issued in connection with U.S. Appl. No. 15/888,789, filed Apr. 30, 2018, 14 pages.
North American MPEG-2 Information, "The MPEG-2 Transport Stream," Retrieved from the Internet: URL: http://www.coolstf.com/mpeg/#ts, 2006, pp. 1-5.
Notice of Allowance dated Nov. 7, 2019, issued in connection with U.S. Appl. No. 16/416,714, filed May 20, 2019, 10 pages.
Notice of Allowance dated Sep. 22, 2017, issued in connection with U.S. Appl. No. 15/009,319, filed Jan. 28, 2016, 8 pages.
Notice of Allowance dated Jan. 9, 2019, issued in connection with U.S. Appl. No. 15/888,789, filed Feb. 5, 2018, 8 pages.
Palm, Inc., "Handbook for the Palm VII Handheld," May 2000, 311 pages.
Park et al., "Group Synchronization in MultiCast Media Communications," Proceedings of the 5th Research on Multicast Technology Workshop, 2003, 5 pages.
Polycom Conference Composer User Guide, copyright 2001, 29 pages.
Presentations at WinHEC 2000, May 2000, 138 pages.
PRISMIQ, Inc., "PRISMIQ Media Player User Guide," 2003, 44 pages.
Rothermel et al., "An Adaptive Stream Synchronization Protocol," 5th International Workshop on Network and Operating System Support for Digital Audio and Video, 1995, 13 pages.
Schulzrinne H., et al., "RTP: A Transport Protocol for Real-Time Applications, RFC 3550," Network Working Group, 2003, pp. 1-89.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Van Buskirk, Eliot, "Music Needs 'Connective Tissue' and Facebook Wants to Build It," E http://evolver.fm/2011/09/01/music-needs-connective-tissue-and-facebook-wants-to-build-it, 2011, 6 pages.
Yamaha DME 32 manual: copyright 2001.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

\* cited by examiner

SYSTEMS AND METHODS OF DISTRIBUTING AUDIO TO ONE OR MORE PLAYBACK DEVICES

CROSS-REFERENCE TO RELATED APPLICATIONS

This application claims priority under 35 U.S.C. § 120 to, and is a continuation of, U.S. non-provisional patent application Ser. No. 16/416,714, filed on May 20, 2019, entitled "SYSTEMS AND METHODS OF DISTRIBUTING AUDIO TO ONE OR MORE PLAYBACK DEVICES," which is incorporated herein by reference in its entirety.

U.S. non-provisional patent application Ser. No. 16/416,714 claims priority under 35 U.S.C. § 120 to, and is a continuation of, U.S. non-provisional patent application Ser. No. 15/888,789, filed on Feb. 5, 2018, entitled "SYSTEMS AND METHODS OF DISTRIBUTING AUDIO TO ONE OR MORE PLAYBACK DEVICES," and issued as U.S. Pat. No. 10,296,288 on May 21, 2019, which is incorporated herein by reference in its entirety.

U.S. non-provisional patent application Ser. No. 15/888,789 claims priority under 35 U.S.C. § 120 to, and is a continuation of, U.S. non-provisional patent application Ser. No. 15/009,319, filed on Jan. 28, 2016, entitled "SYSTEMS AND METHODS OF DISTRIBUTING AUDIO TO ONE OR MORE PLAYBACK DEVICES," and issued as U.S. Pat. No. 9,886,234 on Feb. 6, 2018, which is incorporated herein by reference in its entirety.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless WiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

Figure 1:
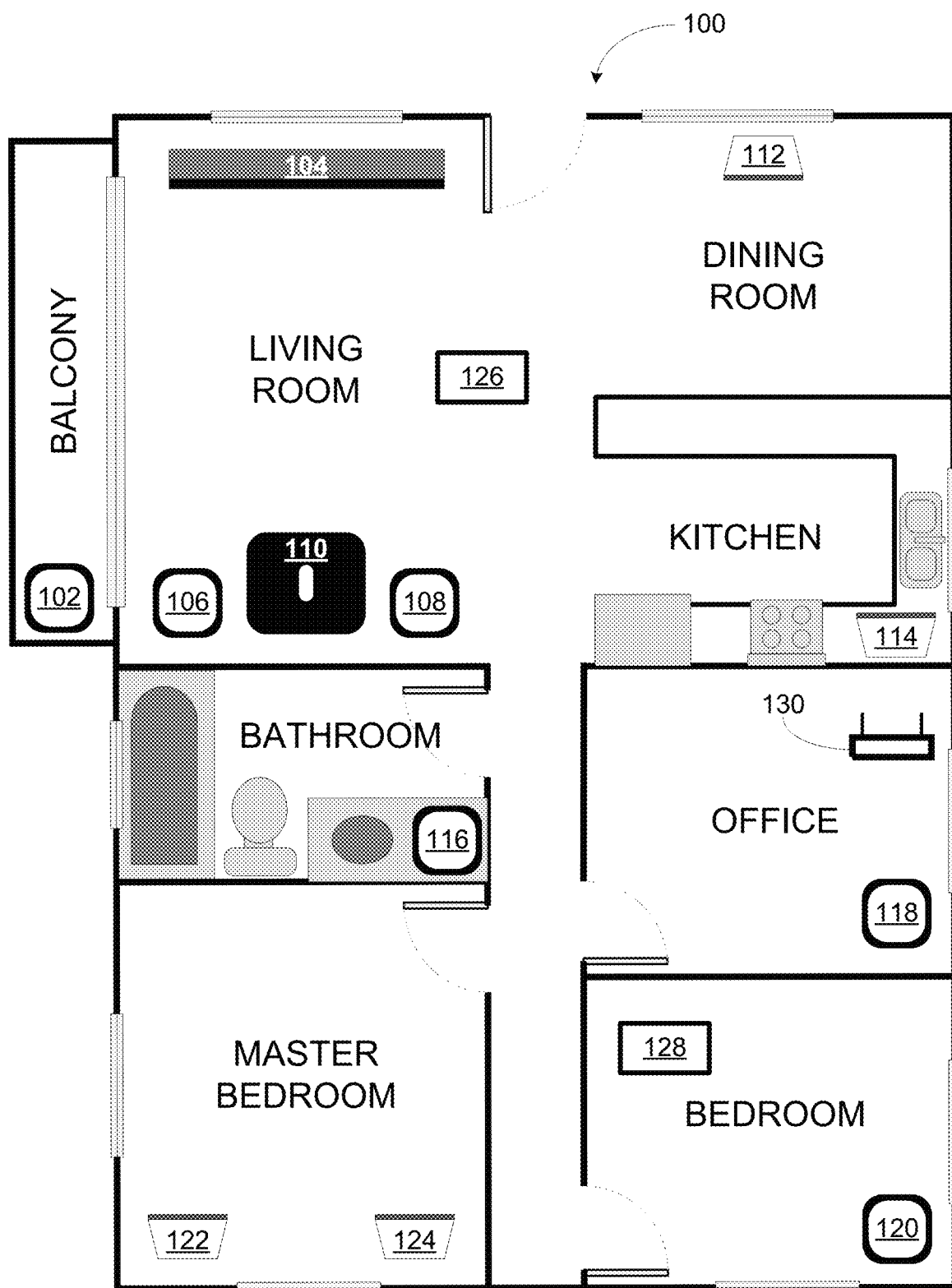
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

In some examples, one or more playback devices may stream and play audio content according to audio processing algorithms that may be customized for each playback device, or even customized for each transducer of each playback device. For instance, a playback device may include a first woofer, a second woofer, and a tweeter. As such, the playback device may use the audio content to generate a first audio stream for the first woofer, a second audio stream for the second woofer, and a third audio stream for the tweeter. This may further involve operations such as file format conversion, sample rate conversion, bit depth conversion, frequency-dependent amplification or attenuation, volume limiting, phase correction, and the like.

Depending on the capabilities of the playback devices, such audio processing performed by the playback devices may cause undesirable delay time between receiving audio content and playing the audio content, especially in cases where multiple playback devices are playing the audio content in synchrony. This may render the playback devices somewhat unsuited for applications such as lip-syncing audio content with video content, studio recording, and public address and stage monitoring for live performances. One way to alleviate this problem is to process audio using a computing device that is not designated to play the audio content. This may be especially helpful if the computing device has processing capacity superior to that of the playback devices.

In this example, the computing device may receive information about each of the playback devices such as specifications or model designations, frequency or phase response for transducers, volume limits, information regarding the environment or room in which the playback devices are located, or locations of the playback devices relative to each other. Such information may be received via a user-interface of the computing device, from a server associated with the playback devices, or from the one or more playback devices themselves.

The computing device may use this information to determine parameters of the audio processing algorithms. Alternatively, the one or more playback devices may determine the parameters of the audio processing algorithms and provide the parameters to the computing device. In either case, the computing device may generate audio streams according to the respective audio processing algorithms. Lastly, the computing device may send the audio streams to the corresponding playback devices.

When the audio streams are received by the one or more playback devices, the only task remaining might be to convert the received audio streams from digital to analog so that the audio streams may be provided to the respective transducers. In the live audio context, this may reduce the amount of processing time between production of the live audio content and playback of the audio content by the one or more playback devices. Ideally, the processing time might be imperceptible to listeners.

Accordingly, some examples described herein include, among other things, a computing device using information about how one or more playback devices are configured to generate audio streams to be sent to various transducers of the one or more playback devices. Other aspects of the examples will be made apparent in the remainder of the description herein.

In one example, a non-transitory computer readable medium stores instructions that, when executed by a computing device, cause the computing device to perform functions. The functions include receiving data indicating a configuration of one or more playback devices. The one or more playback devices may include one or more transducers. The functions further include, based on the received data, associating each of one or more audio streams respectively with at least one transducer of the one or more transducers. The functions further include generating the one or more audio streams and sending at least one of the generated one or more audio streams to each of the one or more playback devices.

In another example, a method includes receiving data indicating a configuration of one or more playback devices. The one or more playback devices may include one or more transducers. The method further includes, based on the received data, associating each of one or more audio streams respectively with at least one transducer of the one or more transducers. The method further includes generating the one or more audio streams and sending at least one of the generated one or more audio streams to each of the one or more playback devices.

In yet another example, a computing device includes one or more processors and a non-transitory computer readable medium storing instructions that, when executed by the one or more processors, cause the computing device to perform functions. The functions include receiving data indicating a configuration of one or more playback devices. The one or more playback devices may include one or more transducers. The functions further include, based on the received data, associating each of one or more audio streams respectively with at least one transducer of the one or more transducers. The functions further include generating the one or more audio streams and sending at least one of the generated one or more audio streams to each of the one or more playback devices.

It will be understood by one of ordinary skill in the art that this disclosure includes numerous other embodiments. While some examples described herein may refer to functions performed by given actors such as "users" and/or other entities, it should be understood that this is for purposes of explanation only. The claims should not be interpreted to require action by any such example actor unless explicitly required by the language of the claims themselves.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102, 104, 106, 108, 110, 112, 114, 116, 118, 120, 122, and 124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
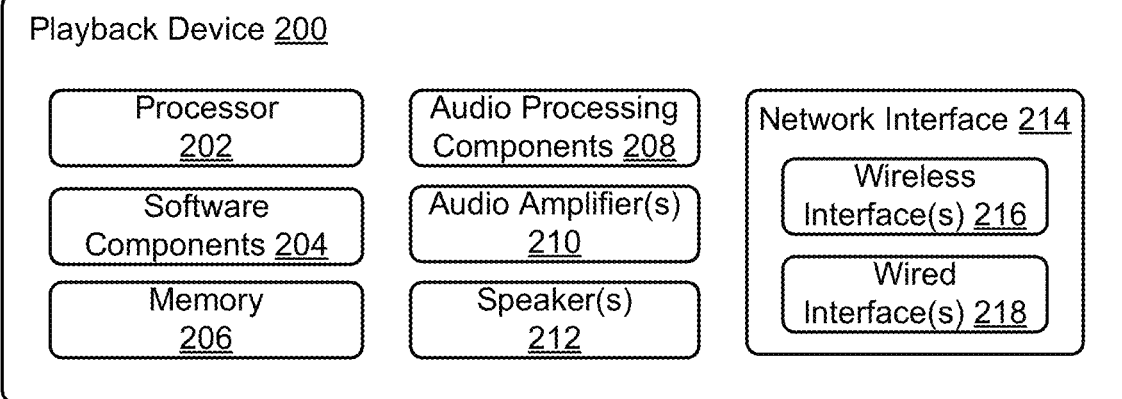
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 might not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The microphone(s) 220 may include an audio sensor configured to convert detected sounds into electrical signals. The electrical signal may be processed by the audio processing components 208 and/or the processor 202. The microphone(s) 220 may be positioned in one or more orientations at one or more locations on the playback device 200. The microphone(s) 220 may be configured to detect sound within one or more frequency ranges. In one case, one or more of the microphone(s) 220 may be configured to detect sound within a frequency range of audio that the playback device 200 is capable or rendering. In another case, one or more of the microphone(s) 220 may be configured to detect sound within a frequency range audible to humans. Other examples are also possible.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being played by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
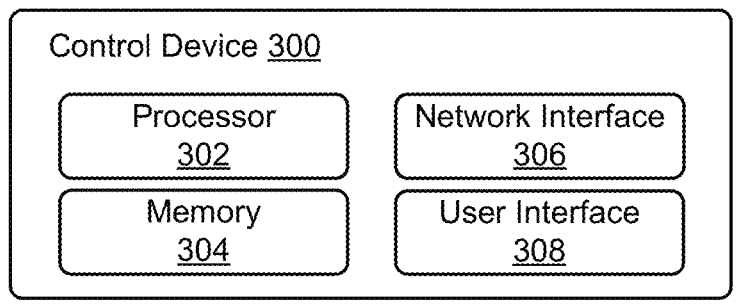
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™ iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

The microphone(s) 310 may include an audio sensor configured to convert detected sounds into electrical signals. The electrical signal may be processed by the processor 302. In one case, if the control device 300 is a device that may also be used as a means for voice communication or voice recording, one or more of the microphone(s) 310 may be a microphone for facilitating those functions. For instance, the one or more of the microphone(s) 310 may be configured to detect sound within a frequency range that a human is capable of producing and/or a frequency range audible to humans. Other examples are also possible.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
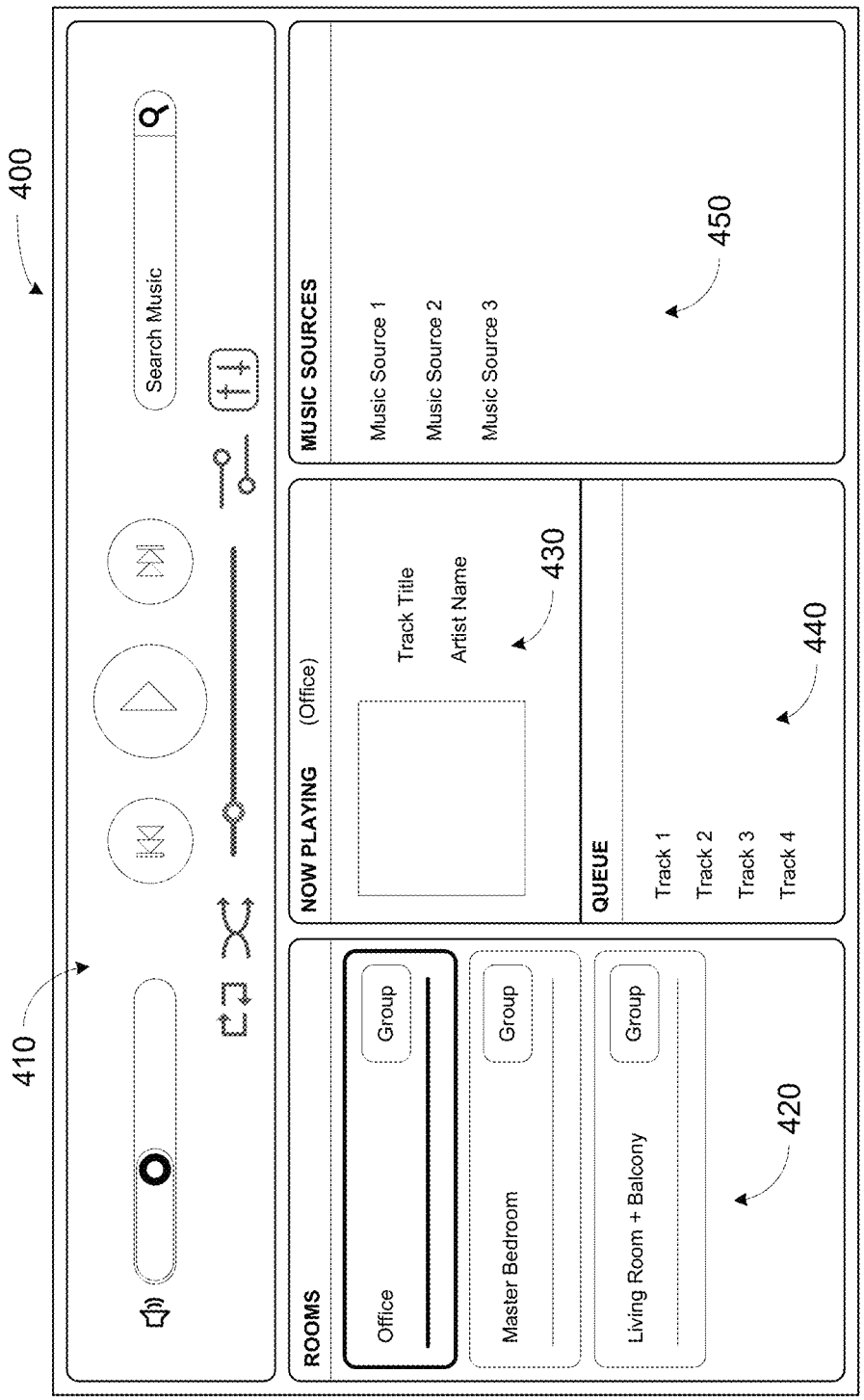
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

III. Example Methods and Systems Related to Centralized Audio Processing

As discussed above, some examples described herein include, among other things, a computing device using information about how one or more playback devices are configured to generate audio streams to be sent to various transducers of the one or more playback devices. Other aspects of the examples will be made apparent in the remainder of the description herein.

Figure 5:
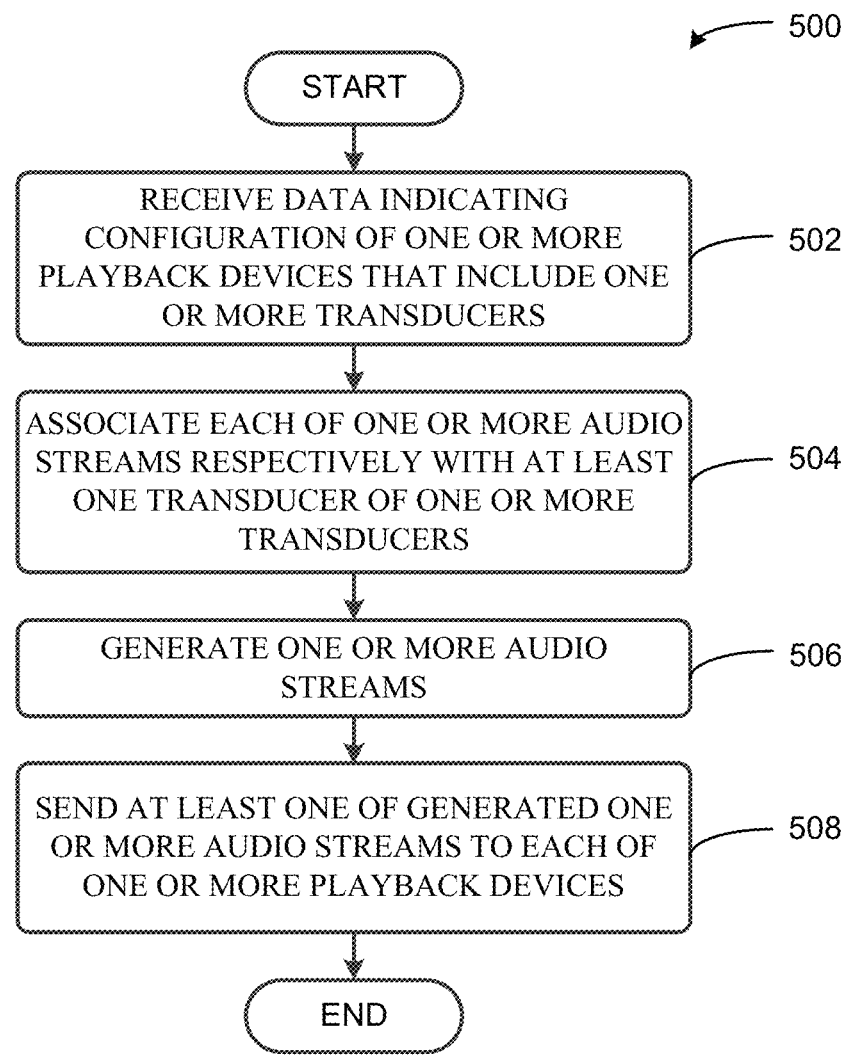
FIG. 5 shows a flow diagram of an example method.

The method 500 shown in FIG. 5 presents an example method that can be implemented within an operating environment including, for example, one or more of the media playback system 100 of FIG. 1, one or more of the playback device 200 of FIG. 2, and one or more of the control device 300 of FIG. 3. The method 500 may involve other devices as well. The method 500 may include one or more operations, functions, or actions as illustrated by one or more of blocks 502, 504, 506, and 508. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the method 500 and other processes and methods disclosed herein, the flowcharts show functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk(s) or hard drive(s). In some embodiments, the program code may be stored in memory (e.g., disks or disk arrays) associated with and/or connected to a server system that makes the program code available for download (e.g., an application store or other type of server system) to desktop/laptop computers, smart phones, tablet computers, or other types of computing devices. The computer readable medium may include non-transitory computer readable media, for example, such as computer readable media that stores data for short periods of time like register memory, processor cache, and Random Access Memory (RAM). The computer readable medium may also include non-transitory media, such as secondary or persistent long-term storage, like read-only memory (ROM), optical or magnetic disks, compact-disc read-only memory (CD-ROM), for example. The computer readable media may also be any other volatile or non-volatile storage systems. The computer readable medium may be considered a computer readable storage medium, for example, or a tangible storage device. In addition, for the method 500 and other processes and methods disclosed herein, each block in FIG. 5 may represent circuitry that is wired to perform the specific logical functions in the process.

Figure 6:
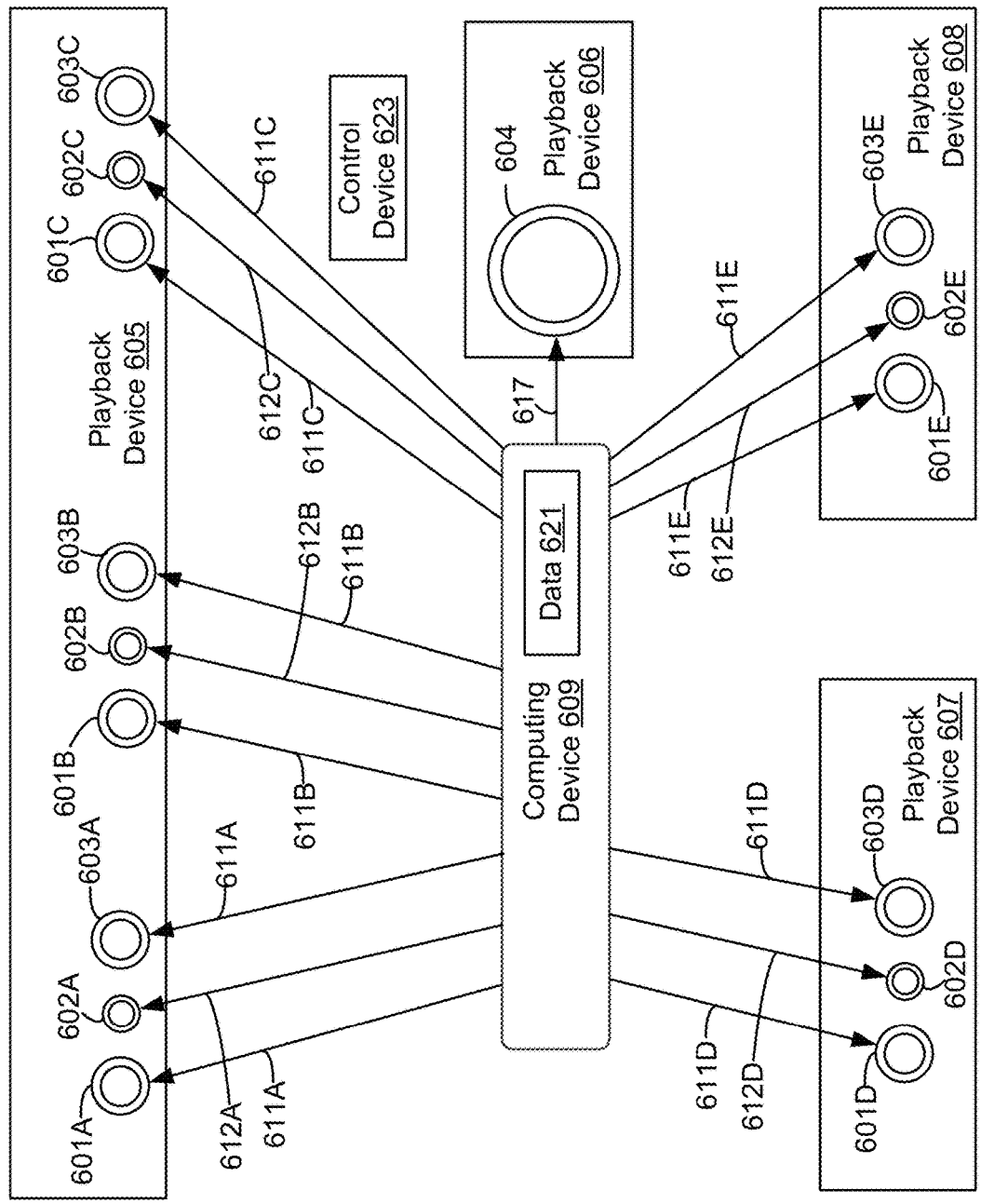
FIG. 6 shows a computing device, a control device, and multiple playback devices, according to an example embodiment.

FIG. 6 depicts various devices that are related to the method 500. The playback device 605 includes transducers 601A, 602A, 603A, 601B, 602B, 603B, 601C, 602C, and 603C. The transducers 601A-C and 603A-C may be woofers and the transducers 602A-C may be tweeters. The playback device 606 may include a subwoofer 604. The playback device 607 may include woofers 601D and 603D, and a tweeter 602D. The playback device 608 may include woofers 601E and 603E, and a tweeter 602E. Other configurations of the playback devices 605-608 are possible.

The computing device 609 may be an instance of the playback device 200 or the control device 300, however the computing device 609 may also include any general-purpose computing device or specific-purpose computing device that is configured to communicate with the playback devices 605-608 and/or the control device 623 via a wired or wireless connection. The computing device 609 may be a desktop or laptop computer, for example.

Herein, any reference to the computing device 609 may include any peripheral device connected to the computing device 609 via a wired or wireless connection. That is, any function described as performed by the computing device 609 herein may, in some examples, be performed in concert with, or independently by, a peripheral device connected to the computing device 609.

The control device 623 may be an instance of the control device 300 that is configured to control the playback devices 605-608.

Referring to FIG. 5, at block 502 the method 500 includes receiving data indicating a configuration of one or more playback devices. For instance, the computing device 609 may receive data 621 indicating a configuration of the playback devices 605-608.

The data 621 may be received via a user-interface (e.g., keyboard, keypad, and/or mouse) of the computing device 609, from any of the playback devices 605-608, from the control device 623, or from a server (not shown), among other possibilities. In some cases, the computing device 609 may, from time to time, receive new data reflecting changes to user-selected frequency equalization settings of the playback devices 605-608 and/or changes within the environment of the playback devices 605-608 detected by one or more of the playback devices 605-608.

At block 504, the method 500 includes, based on the received data, associating each of one or more audio streams respectively with at least one transducer of the one or more playback devices. For instance, the computing device 609 may associate the audio streams depicted in FIG. 6 with the transducers of the playback devices 605-608 as shown in Table 1. In the example below, the audio streams may be generated by processing and/or mixing four-channel audio content (e.g., 3.1 surround sound) retrieved by the computing device 609. However, other forms of audio content may be used to generate the audio streams as well.

TABLE 1

| Channel of Audio Content | Generated Audio Stream | Associated Transducer(s) |
|---|---|---|
| 1 | 611A | 601A, 603A |
| 1 | 612A | 602A |
| 2 | 611B | 601B, 603B |
| 2 | 612B | 602B |
| 3 | 611C | 601C, 603C |
| 3 | 612C | 602C |
| 1/2 | 611D | 601D, 603D |
| 1/2 | 612D | 602D |
| 2/3 | 611E | 601E, 603E |
| 2/3 | 612E | 602E |
| 4 | 617 | 604 |

Table 1 indicates that the computing device 609 may use a first channel (e.g., left) of the audio content to generate the audio streams 611A and 612A, a second channel (e.g., center) of the audio content to generate the audio streams 611B and 612B, and a third channel (e.g., right) of the audio content to generate the audio streams 611C and 612C. Table 1 further indicates that the computing device 609 may mix the first channel and the second channel to generate the audio streams 611D and 612D. Table 1 further indicates that the computing device 609 may mix the second channel and the third channel to generate the audio streams 611E and 612E. Table 1 further indicates that the computing device 609 may use a fourth channel of the audio content to generate the audio stream 617.

In some examples, the data 621 may include the associations between channels of audio content, audio streams, and transducers as shown in Table 1. The data 621 may also include sets of one or more parameters of audio processing algorithms that correspond respectively to the audio streams 611A, 612A, 611B, 612B, 611C, 612C, 611D, 612D, 611E, 612E, and 617. In this context, the data 621 may also map the audio processing algorithms to the respective transducers of the playback devices 605-608. For example, the data 621 may map parameters of a particular audio processing algorithm to the transducers 601A and 603A, and the computing device 609 may analyze the data 621 and responsively generate the audio stream 611A by using the particular audio processing algorithm to process the audio content. The computing device 609 may send the generated audio stream 611A to the playback device 605 to be routed to the transducers 601A and 603A by the playback device 605.

In other examples, the computing device 609 may associate the audio streams with the transducers without receiving explicit information regarding the associations. For instance, the data 621 may include information such as model designation or specifications of the respective playback devices 605-608. In addition, the data 621 may include information regarding how many transducers and which type of transducers (e.g., tweeter, woofer, subwoofer) the respective playback devices 605-608 include. The data 621 may further include frequency response, phase response, and/or volume limits for each of the transducers of the playback devices 605-608. Further, the data 621 may include information regarding the locations of the respective playback devices 605-608 within an environment (e.g., a room), or information characterizing the environment. The computing device 609 may use this information to determine a quantity of audio streams to be generated and to associate the audio streams with the transducers as shown in Table 1, for example.

For instance, the data 621 may indicate that the playback device 605 (e.g., a "soundbar") is located near a front end of a room and that the playback device 605 is configurable to play three channels of audio content via respective sets of transducers 601A-603A, 601B-603B, and 601C-603C. The data 621 may also indicate that transducers 601A-C and 603A-C are woofers configured to play mid-range audio frequencies (e.g., 120 Hz-2 kHz). The data 621 may also indicate that the transducers 602A-C are tweeters configured to play high-range frequencies (e.g., 2 kHz-20 kHz). The data 621 may indicate any information about the playback device 605 implicitly or explicitly. For instance, the computing device 609 might infer the quantity and type transducers included in the playback device 605 based on the model designation of the playback device 605 represented by the data 621.

By further example, the data 621 may indicate that the transducer 604 of the playback device 606 is configured to play low-range frequencies (e.g., <120 Hz). The data 621 may indicate any information about the playback device 606 implicitly or explicitly.

In addition, the data 621 may indicate that the playback device 607 is located near a rear left portion of the room and that the playback device 607 is configured to play one or two channels of audio content via the transducers 601D-603D. The data 621 may also indicate that transducers 601D and 603D are woofers configured to play mid-range audio frequencies (e.g., 120 Hz-2 kHz). The data 621 may also indicate that the transducer 602D is a tweeter configured to play high-range frequencies (e.g., 2 kHz-20 kHz). The data 621 may indicate any information about the playback device 607 implicitly or explicitly.

In addition, the data 621 may indicate that the playback device 608 is located near a rear right portion of the room and that the playback device 608 is configured to play one or two channels of audio content via the transducers 601E-603E. The data 621 may also indicate that transducers 601E and 603E are woofers configured to play mid-range audio frequencies (e.g., 120 Hz-2 kHz). The data 621 may also indicate that the transducer 602E is a tweeter configured to play high-range frequencies (e.g., 2 kHz-20 kHz). The data 621 may indicate any information about the playback device 608 implicitly or explicitly.

In some examples, the computing device 609 may, based on the data 621, determine a quantity of audio streams to be generated by the computing device 609. For instance, the data 621 may indicate the quantity and types of transducers included in each of the playback devices 605-608. As described below, the computing device 609 may determine that four-channel audio content (e.g., 3.1 channel surround) is to be played by the playback devices 605-608 in the form of eleven audio streams 611A, 612A, 611B, 612B, 611C, 612C, 611D, 612D, 611E, 612E, and 617.

The computing device 609 may associate the audio streams with the transducers as shown in Table 1 based on the data 621 characterizing the playback devices 605-608 as described above. For example, the computing device 609 may recognize that, based on the configuration of the playback devices 605-608, the first channel of audio content may be provided to the transducers 601A-603A (e.g., because the transducers 601A-603A may be located at the front left portion of the room and the first channel may be a left channel). Furthermore, the computing device 609 may recognize that the first channel of the audio content may be processed using low pass filtering and/or high pass filtering and provided to the transducers 601A and 603A as the audio stream 611A (e.g., because the transducers 601A and 603A may be mid-range woofers). Additionally, the computing device 609 may recognize that the first channel of the audio content may be processed using high pass filtering and provided to the transducer 602A as the audio stream 612A (e.g., because the transducer 602A may be a high-range tweeter.)

By further example, the computing device 609 may recognize that, based on the configuration of the playback devices 605-608, the second channel of audio content may be provided to the transducers 601B-603B (e.g., because the transducers 601B-603B may be located at the front center portion of the room and the second channel may be a center channel). Furthermore, the computing device 609 may recognize that the second channel of the audio content may be processed using low pass filtering and/or high pass filtering and provided to the transducers 601B and 603B as the audio stream 611B (e.g., because the transducers 601B and 603B may be mid-range woofers). Additionally, the computing device 609 may recognize that the second channel of the audio content may be processed using high pass filtering and provided to the transducer 602B as the audio stream 612B (e.g., because the transducer 602B may be a high-range tweeter.)

In addition, the computing device 609 may recognize that, based on the configuration of the playback devices 605-608, the third channel of audio content may be provided to the transducers 601C-603C (e.g., because the transducers 601C-603C may be located at the front right portion of the room and the third channel may be a right channel). Furthermore, the computing device 609 may recognize that the third channel of the audio content may be processed using low pass filtering and/or high pass filtering and provided to the transducers 601C and 603C as the audio stream 611C (e.g., because the transducers 601C and 603C may be mid-range woofers). Additionally, the computing device 609 may recognize that the third channel of the audio content may be processed using high pass filtering and provided to the transducer 602C as the audio stream 612C (e.g., because the transducer 602C may be a high-range tweeter.)

Also, the computing device 609 may recognize that, based on the configuration of the playback devices 605-608, the first and second channels of audio content may be mixed and provided to the transducers 601D-603D (e.g., because the transducers 601D-603D may be located at the rear left portion of the room and there might not be a playback device corresponding to the rear center of the room). Furthermore, the computing device 609 may recognize that the first and second channels of the audio content may be mixed and processed using low pass filtering and/or high pass filtering and provided to the transducers 601D and 603D as the audio stream 611D (e.g., because the transducers 601D and 603D may be mid-range woofers). Additionally, the computing device 609 may recognize that the first and second channels of the audio content may be mixed and processed using high pass filtering and provided to the transducer 602D as the audio stream 612D (e.g., because the transducer 602D may be a high-range tweeter.)

Additionally, the computing device 609 may recognize that, based on the configuration of the playback devices 605-608, the second and third channels of audio content may be mixed and provided to the transducers 601E-603E (e.g., because the transducers 601E-603E may be located at the rear right portion of the room and there might not be a playback device corresponding to the rear center of the room). Furthermore, the computing device 609 may recognize that the second and third channels of the audio content may be mixed and processed using low pass filtering and/or high pass filtering and provided to the transducers 601E and 603E as the audio stream 611E (e.g., because the transducers 601E and 603E may be mid-range woofers). Additionally, the computing device 609 may recognize that the second and third channels of the audio content may be mixed and processed using high pass filtering and provided to the transducer 602E as the audio stream 612E (e.g., because the transducer 602E may be a high-range tweeter.)

Lastly, the computing device 609 may recognize that, based on the configuration of the playback devices 605-608, the fourth channel of audio content may be provided to the transducer 604 (e.g., because the transducer 604 is a subwoofer and the fourth channel might not correspond to a particular location of a room). Furthermore, the computing device 609 may recognize that the fourth channel of the audio content may be processed using low pass filtering and provided to the transducer 604 as the audio stream 617.

In some cases, there may be a one-to-one relationship between the audio streams and the transducers of the playback devices 605-608, but in other cases, the same audio stream may be provided to multiple transducers of the playback devices 605-608. By further example, the same audio stream may be provided to multiple transducers of the same playback device. Additionally, there may be a one-to-one relationship between channels of audio content retrieved by the computing device 609 and the audio streams, or the computing device 609 might generate more or less audio streams than there are channels of the retrieved audio content. Generation of audio streams by the computing device 609 is described in more detail below with regard to block 506.

At block 506, the method 500 includes, based on the data, generating the one or more audio streams. For example, the computing device 609 may, based on the data 621, generate the audio streams 611A, 612A, 611B, 612B, 611C, 612C, 611D, 612D, 611E, 612E, and 617. In some examples in which the computing device 609 is a playback device, the computing device 609 may generate its own audio stream(s) for playback by its own transducers.

In some examples, the computing device 609 may receive, from any of the playback devices 605-608 or the control device 623, a command to generate the audio streams. For instance, any of the playback devices 605-608 or the control device 623 may receive input via a user-interface and responsively send the command to generate the audio streams to the computing device 609. In this context, the computing device 609 may generate the audio streams in response to receiving the command.

By further example, the computing device 609 may retrieve digital audio content from memory accessible by the computing device 609 or from another computing device such as a server. The command to generate the audio streams received by the computing device 609 may include a uniform resource locator (URL), a uniform resource indicator (URI), or some other indication of a network location from which the digital audio content is available. The URL or URI may be received by the computing device 609 from another device as well. In this context, the computing device 609 may use the retrieved digital audio content to generate the one or more audio streams.

In another example, the computing device 609 may receive analog audio content via an input port (e.g., line-in port) of the computing device 609 and convert the analog audio content to digital audio content using an analog-to-digital converter. The command received by the computing device 609 may specify that the computing device 609 is to generate audio streams using the analog audio content received by the input port. In this context, the computing device 609 may use the converted digital audio content to generate the one or more audio streams.

In one example, the computing device 609 determines (e.g., calculates), based on the data 621, parameters of audio processing algorithms that correspond respectively to one or more of the transducers of the playback devices 605-608. The computing device 609 may then use the audio processing algorithms to generate audio streams that correspond respectively to one or more of the transducers. In another example, the computing device 609 instead receives (i.e., does not determine) parameters of the audio processing algorithms that correspond respectively to one or more of the transducers of the playback devices 605-608. In this case, the computing device 609 may use the received parameters to generate the audio streams.

Whether the computing device 609 receives or determines parameters of the audio processing algorithms, the computing device 609 may process, for each of the one or more audio streams, audio content according to the respective audio processing algorithms. As an example, the computing device 609 may first translate the retrieved audio content from one file format to another (e.g., mp3 to pulse code modulation (PCM) format). In some examples, the computing device 609 may "downconvert" a sample rate of the retrieved audio content, for example, from 96 kHz to 44.1 kHz. The computing device 609 may also downconvert the bit depth of the retrieved audio content. Generally, the computing device 609 may perform file format conversion, sample rate conversion, and bit depth conversion prior to performing transducer-specific audio processing, but other examples are possible.

Next, the computing device 609 may perform one or more of the following to the audio content in order to generate each of the audio streams: frequency-dependent amplification, frequency-dependent attenuation (e.g., low-pass or high-pass filtering), volume limiting, phase delay, mixing one or more channels of the retrieved audio content, or adding a reverberation effect.

For instance, for a given audio stream, the computing device 609 might boost low-end frequencies and/or attenuate high-end frequencies. The computing device 609 might "clip" the retrieved audio content such that no portion of the given audio stream exceeds a given level of volume. Further, the computing device 609 might add a delay effect to a particular frequency range with respect to another frequency range of the audio content. Any or all of these processes, if applicable, might be applied by the computing device 609 uniquely for each of the audio streams generated by the computing device 609. Any of the above processes may be related to user-selected equalization settings and/or compensating an otherwise undesirable response that would be heard by a listener due to particularities of the environment and/or positioning of the playback devices 605-608.

By further example, the computing device 609 may again perform file format conversion upon the audio streams (e.g., PCM to mp3), before the audio streams are sent to the playback devices 605-608.

At block 508, the method 500 includes sending at least one of the generated one or more audio streams to each of the one or more playback devices. For example, the computing device 609 may send the audio streams 611A-E, 612A-E, and 617 to the corresponding playback devices 605-608.

In the example depicted in FIG. 6, the computing device 609 may send the audio streams 611A-C and 612A-C directly to the playback device 605, the audio stream 617 directly to the playback device 606, the audio streams 611D and 612D directly to the playback device 607, and the audio streams 611E and 612E to the playback device 608. The audio streams may include a universally unique identifier (UUID) of an application that generates the audio streams so that the playback devices may verify that the audio streams are indeed the audio streams and not some other unrelated data.

In various examples, the computing device 609 may "unicast" or "multicast" the audio streams to the playback devices 605-608. In the "unicast" example, the computing device 609 may send, with the audio stream 611A, a network address of the playback device 605. Accordingly, if the playback device 606 were to receive the audio stream 611A, the playback device 606 may forward the audio stream 611A to the playback device 605 based on the network address.

In a "multicast" example, each of the playback devices 605-608 might receive all of the audio streams sent by the computing device 609, but the audio streams might each include an indication of which playback devices are to play that particular audio stream. In this way, each playback device may use the indications included in each audio stream to parse the audio streams and play the audio streams that are intended for that particular playback device.

In another example, any or all of the audio streams may be sent to corresponding playback devices using one of the playback devices 605-608 (e.g., a group coordinator device) or the control device 632 as an intermediary. For instance, the computing device 609 may send the audio streams 611A-611E, 612A-612E, and 617 to the playback device 607, and the playback device 607 may send the audio streams 611A-611C and 612A-612C to the playback device 605, send the audio stream 617 to the playback device 606, send the audio streams 611E and 612E to the playback device 608, and play the audio streams 611D and 612D.

In addition, the computing device 609 may send timing data to one or more of the playback devices 605-608 so that one or more of the playback devices 605-608 may play the audio streams in synchrony. Furthermore, the timing data may allow the playback devices 605-608 to play audio content in synchrony with video content played by a video playback device (not shown).

The computing device 609 may also send, to the playback devices 605-608, data mapping the audio streams 611A-611E, 612A-612E, and 617 to one or more respective transducers of the playback devices 605-608. For instance, along with the audio streams 611A and 612A, the computing device 609 may send, to the playback device 605, information indicating that the audio stream 611A is to be played by the transducers 601A and 603A and information indicating that the audio stream 612A is to be played by the transducer 602A.

In some examples, the computing device 609 may process audio for the playback devices 605-608 after the playback devices 605-608 are reconfigured. Also, the computing device 609 may process audio for other playback devices in addition to or instead of the playback devices 605-608. For example, the playback devices 605-608 may be reconfigured so that all of the woofers 601A-E and 603A-E receive identical (e.g., monaural) mid-range audio streams and all of the tweeters 602A-E receive identical (e.g., monaural) high-range audio streams. As such, the computing device 609 may receive new data reflecting changes to the configuration of the playback devices 605-608 and/or reflecting the configuration of additional playback devices.

Figure 7:
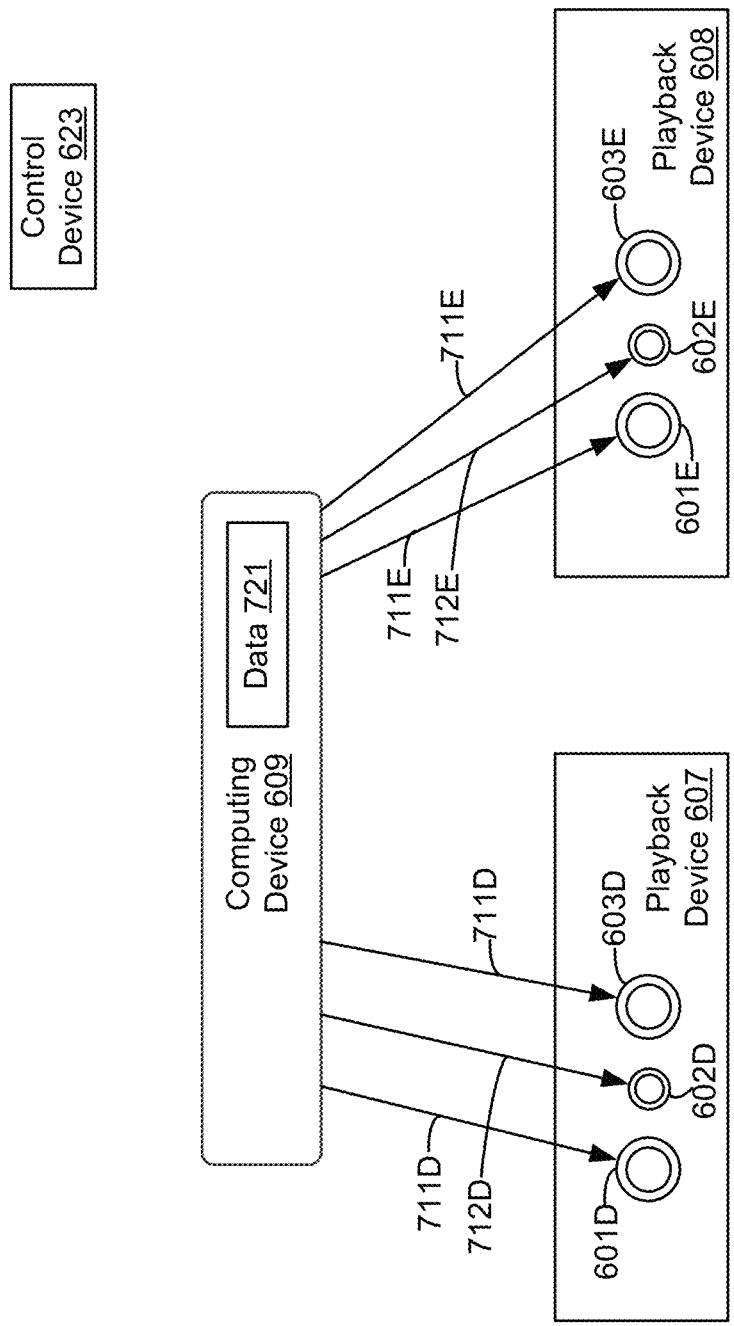
FIG. 7 shows a computing device, a control device, and two playback devices, according to another example embodiment.

Referring to FIG. 7 for example, the computing device 609 may receive the data 721 in any manner in which the data 621 is received as described above. The data 721 may indicate that the playback devices 605 and 606 (not shown in FIG. 7) have been removed from the room or are otherwise no longer associated with the playback devices 607 and 608 in a common playback group. In another example, the playback devices 607 and 608 as shown in FIG. 7 may represent additional playback devices that are not shown in FIG. 6.

The computing device 609 may, based on the received data 721, associate audio streams 711D, 712D, 711E, and 712E respectively with at least one transducer of the transducers 601D, 602D, 603D, 601E, 602E, or 603E. More specifically, the computing device 609 may associate audio streams with transducers as shown below in Table 2.

TABLE 2

| Channel of Audio Content | Generated Audio Stream | Associated Transducer(s) |
|---|---|---|
| 1/2/4 | 711D | 601D, 603D |
| 1/2 | 712D | 602D |
| 2/3/4 | 711E | 601E, 603E |
| 2/3 | 712E | 602E |

In the example depicted in Table 2, the audio content may be four-channel audio content (e.g., 3.1 surround sound) retrieved by the computing device 609. For example, the audio content might include a first (e.g., left) channel, a second (e.g., center) channel, a third (e.g., right) channel, and a fourth (e.g., subwoofer) channel. However, based on the data 721 indicating that only the playback devices 607 and 608 might be available for playing audio content, the computing device 609 may determine that the audio stream 711D may be generated by mixing the first, second, and fourth channels. The computing device 609 may generate the audio stream 711D and provide the audio stream 711D to the playback device 607, which may provide the audio stream 711D to the transducers 601D and 603D. The computing device 609 may also, as shown by Table 2, generate the audio stream 712D by mixing the first and second channels, and provide the audio stream 712D to the playback device 607 so that the playback device 607 may provide the audio stream 712D to the transducer 602D. The computing device 609 may also generate the audio stream 711E by mixing the second, third, and fourth channels, and provide the audio stream 711E to the playback device 608 so that the playback device 608 may provide the audio stream 711E to the transducers 601E and 603E. The computing device 609 may also generate the audio stream 712E by mixing the second and third channels, and provide the audio stream 712E to the playback device 608 so that the playback device 608 may provide the audio stream 712E to the transducer 602E.

IV. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The Specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments.

Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

We claim:

1. A media playback system comprising a first playback device and a second playback device,
the first playback device configured to perform operations comprising:
receiving, via a network interface of the first playback device, data representing a first audio stream representing audio content for playback by the second playback device, wherein the first audio stream is encoded in a first format that is unsupported by the second playback device;
transcoding, via a processor of the first playback device, the first audio stream to one or more second audio streams representing the audio content, the one or more second audio streams encoded in a second format that is supported by the second playback device; and
transmitting, via the network interface, the one or more second audio streams to the second playback device, wherein the first playback device comprises one or more transducers;
the second playback device configured to perform operations comprising:
receiving, via a network interface of the second playback device, the one or more second audio streams;
processing, via a processor of the second playback device, the received one or more second audio streams, wherein processing the received one or more second audio streams comprises converting the received one or more second audio streams to one or more analog audio signals representing the audio content; and
while the one or more transducers of the first playback device are inactive, outputting, via one or more transducers of the second playback device, the one or more analog audio signals representing the audio content.

2. The media playback system of claim 1, wherein the first audio stream is encoded with a first sample rate, and wherein transcoding the first audio stream to the one or more second audio streams comprises:
down-converting the first audio stream from the first sample rate to a second sample rate that is compatible with the second playback device, wherein the second sample rate is lower than the first sample rate, and wherein the first sample rate is incompatible with the second playback device.

3. The media playback system of claim 1, wherein samples in the first audio stream are encoded with a first bit-depth, wherein transcoding the first audio stream to the one or more second audio streams comprises:
converting the samples of the first audio stream from the first bit-depth to a second bit-depth, the second bit-depth lower than the first bit-depth and supported by the second playback device, wherein the first bit-depth is incompatible with the second playback device.

4. The media playback system of claim 1, wherein the first audio stream is encoded in a first file format, and wherein transcoding the first audio stream to the one or more second audio streams comprises:
converting the first audio stream from the first file format to a second file format that is compatible with the second playback device, wherein the first file format is incompatible with the second playback device.

5. The media playback system of claim 1, wherein the first playback device is configured to perform operations further comprising:
before transmitting the one or more second audio streams to the second playback device, applying one or more audio processing algorithms to the one or more second audio streams.

6. The media playback system of claim 5, wherein applying one or more audio processing algorithms to the one or more second audio streams comprises applying a first calibration algorithm that offsets environmental effects corresponding to a physical location of the second playback device.

7. The media playback system of claim 5, wherein applying one or more audio processing algorithms to the one or more second audio streams comprises applying an equalization filter that applies frequency-dependent amplification.

8. The media playback system of claim 5, wherein applying one or more audio processing algorithms to the one or more second audio streams comprises applying a delay algorithm that introduces a particular phase delay to the audio content in the one or more second audio streams.

9. The media playback system of claim 1, wherein the first playback device is configured to perform operations further comprising:
generating respective second audio streams for a first transducer and a second transducer of the first playback device, wherein the first transducer and second transducer of the first playback device are different types of transducers.

10. The media playback system of claim 1, wherein the first playback device is configured to perform operations further comprising:
generating respective second audio streams corresponding to a first channel of the audio content and a second channel of the audio content.

11. A method to be performed by a media playback system comprising a first playback device and a second playback device, the method comprising:
the first playback device receiving, via a network interface of the first playback device, data representing a first audio stream representing audio content for playback by the second playback device, wherein the first audio stream is encoded in a first format that is unsupported by the second playback device;
the first playback device transcoding, via a processor of the first playback device, the first audio stream to one or more second audio streams representing the audio content, the one or more second audio streams encoded in a second format that is supported by the second playback device;
the first playback device transmitting, via the network interface, the one or more second audio streams to the second playback device, wherein the first playback device comprises one or more transducers;
the second playback device receiving, via a network interface of the second playback device, the one or more second audio streams;

the second playback device processing, via a processor of the second playback device, the received one or more second audio streams, wherein processing the received one or more second audio streams comprises converting the received one or more second audio streams to one or more analog audio signals representing the audio content; and while the one or more transducers of the first playback device are inactive, outputting, via one or more transducers of the second playback device, the one or more analog audio signals representing the audio content.

12. The method of claim 11, wherein the first audio stream is encoded with a first sample rate, and wherein transcoding the first audio stream to the one or more second audio streams comprises:

down-converting the first audio stream from the first sample rate to a second sample rate that is compatible with the second playback device, wherein the second sample rate is lower than the first sample rate, and wherein the first sample rate is incompatible with the second playback device.

13. The method of claim 11, wherein samples in the first audio stream are encoded with a first bit-depth, wherein transcoding the first audio stream to the one or more second audio streams comprises:

converting the samples of the first audio stream from the first bit-depth to a second bit-depth, the second bit-depth lower than the first bit-depth and supported by the second playback device, wherein the first bit-depth is incompatible with the second playback device.

14. The method of claim 11, wherein the first audio stream is encoded in a first file format, and wherein transcoding the first audio stream to the one or more second audio streams comprises:

converting the first audio stream from the first file format to a second file format that is compatible with the second playback device, wherein the first file format is incompatible with the second playback device.

15. The method of claim 11, further comprising:

before transmitting the one or more second audio streams to the second playback device, the first playback device applying one or more audio processing algorithms to the one or more second audio streams.

16. The method of claim 15, wherein applying one or more audio processing algorithms to the one or more second audio streams comprises applying a first calibration algorithm that offsets environmental effects corresponding to a physical location of the second playback device.

17. The method of claim 15, wherein applying one or more audio processing algorithms to the one or more second audio streams comprises applying an equalization filter that applies frequency-dependent amplification.

18. The method of claim 15, wherein applying one or more audio processing algorithms to the one or more second audio streams comprises applying a delay algorithm that introduces a particular phase delay to the audio content in the one or more second audio streams.

19. The method of claim 11, further comprising:

the first playback device generating respective second audio streams for a first transducer and a second transducer of the first playback device, wherein the first transducer and second transducer of the first playback device are different types of transducers.

20. The method of claim 11, further comprising:

the first playback device generating respective second audio streams corresponding to a first channel of the audio content and a second channel of the audio content.

\* \* \* \* \*